(12) United States Patent
Zhang et al.

(10) Patent No.: US 12,690,472 B2
(45) Date of Patent: Jul. 21, 2026

(54) PACKAGE STRUCTURE ASSEMBLY FOR TVS DEVICES

(71) Applicant: Littelfuse Semiconductor (Wuxi) Co., Ltd., Wuxi (CN)

(72) Inventors: Lucas Zhang, Wuxi (CN); Chao Gao, Wuxi (CN); Glenda Zhang, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 356 days.

(21) Appl. No.: 18/227,051

(22) Filed: Jul. 27, 2023

(65) Prior Publication Data

US 2024/0047317 A1 Feb. 8, 2024

(30) Foreign Application Priority Data

Aug. 2, 2022 (CN) .......................... 202210920936.0

(51) Int. Cl.
H10W 70/40 (2026.01)
H10W 72/00 (2026.01)
(Continued)

(52) U.S. Cl.
CPC ....... H10W 70/481 (2026.01); H10W 70/417 (2026.01); H10W 70/442 (2026.01);
(Continued)

(58) Field of Classification Search
None
See application file for complete search history.

(56) References Cited

U.S. PATENT DOCUMENTS

2012/0248592 A1* 10/2012 Hata ................. H01L 23/49562
257/676
2016/0365305 A1* 12/2016 Ding ...................... H01L 24/33
(Continued)

FOREIGN PATENT DOCUMENTS

CN      113632214 A      11/2021
EP      2930747 A1      10/2015
(Continued)

OTHER PUBLICATIONS

European Search Report for EP Application No. 23188148.3, dated Nov. 30, 2023, 9 pages.

*Primary Examiner* — Sue A Purvis
*Assistant Examiner* — Jordan M Klein
(74) *Attorney, Agent, or Firm* — KDW Firm PLLC

(57) ABSTRACT

Provided herein are package structures including a first lead frame having a first pedestal and a first lead extending from the first pedestal. A first perimeter ridge defines a first recessed area in a first main side of the first pedestal, wherein a die pad is positioned within the first recessed area. The package structure may further include a chip layer having a first main side opposite a second main side, wherein the second main side is in abutment with the first perimeter ridge of the pedestal of the first lead frame. The package structure may further include a clip including a second pedestal and a lead connector extending from the second pedestal, wherein a second perimeter ridge defines a second recessed area in a second main side of the second pedestal, and wherein the second perimeter ridge is in abutment with the first main side of the chip layer.

20 Claims, 6 Drawing Sheets

100

(51) Int. Cl.
    *H10W 74/10*       (2026.01)
    *H10W 90/00*       (2026.01)

(52) U.S. Cl.
    CPC ........ *H10W 74/111* (2026.01); *H10W 72/073*
        (2026.01); *H10W 72/076* (2026.01); *H10W*
        *72/886* (2026.01); *H10W 90/736* (2026.01);
                  *H10W 90/767* (2026.01)

(56)            References Cited

U.S. PATENT DOCUMENTS

| | | | | |
|---|---|---|---|---|
| 2019/0139873 A1* | 5/2019 | Saito | ........................ | H01L 21/56 |
| 2019/0140444 A1* | 5/2019 | To | ........................... | H02M 3/07 |

FOREIGN PATENT DOCUMENTS

| | | | | | |
|---|---|---|---|---|---|
| EP | 3971959 | A1 | | 3/2022 | |
| JP | S6066846 | A | | 4/1985 | |
| JP | H01125941 | A | * | 5/1989 | |
| KR | 20150097922 | A | * | 8/2015 | ............. H01L 23/48 |

* cited by examiner

100

106

102

104

200

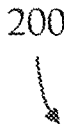

Providing a first lead frame including
a first pedestal and a first lead
extending from the first pedestal,
wherein a first perimeter ridge defines
a first recessed area in a first main
side of the first pedestal, and wherein
a die pad is positioned within the first
recessed area
*201*

Connecting a chip layer to the first lead
frame, wherein the chip layer includes a
first main side opposite a second main
side, and wherein the second main side
is in abutment with the first perimeter
ridge of the pedestal of the first lead
frame
*202*

Connecting a clip to the chip layer,
wherein the clip includes a second
pedestal and a lead connector
extending from the second pedestal,
wherein a second perimeter ridge
defines a second recessed area in a
second main side of the second
pedestal, and wherein the second
perimeter ridge is in abutment with the
first main side of the chip layer
*203*

*FIG. 6*

PACKAGE STRUCTURE ASSEMBLY FOR TVS DEVICES

FIELD OF THE DISCLOSURE

The disclosure relates generally to the field of semiconductor devices and, more particularly, to a package structure assembly for transient-voltage-suppression (TVS) devices.

BACKGROUND OF THE DISCLOSURE

Packaging an integrated circuit is typically the final stage of semiconductor device fabrication. During packaging, a semiconductor die, which represents the core of a semiconductor device, is encased in a housing that protects the die against physical damage and corrosion. For example, semiconductor dies are commonly mounted on a copper substrate, using solder alloy reflow, conductive epoxy, and the like. The mounted semiconductor die is often then encapsulated within a plastic or epoxy compound.

As power requirements of semiconductor devices have increased, larger semiconductor dies, sometimes referred to as "large area semiconductor dies," have become necessary for providing correspondingly greater levels of current handling. In some cases, such as in TVS diode applications, multiple chips are connected in series in a stacked configuration to provide a sufficiently high breakdown voltage. However, there are some difficulties with solder paste curing during the assembly process, as the solder paste can easily run to the chip edge and cause overflow issues. It is with respect to at least this drawback that the present disclosure is provided.

SUMMARY

The Summary is provided to introduce a selection of concepts in a simplified form, the concepts further described below in the Detailed Description. The Summary is not intended to identify key features or essential features of the claimed subject matter, nor is the Summary intended as an aid in determining the scope of the claimed subject matter.

In some embodiments, a package structure may include a first lead frame including a first pedestal and a first lead extending from the first pedestal, wherein a first perimeter ridge defines a first recessed area in a first main side of the first pedestal, and wherein a die pad is positioned within the first recessed area. The package structure may further include a chip layer having a first main side opposite a second main side, wherein the second main side is in abutment with the first perimeter ridge of the pedestal of the first lead frame. The package structure may further include a clip including a second pedestal and a lead connector extending from the second pedestal, wherein a second perimeter ridge defines a second recessed area in a second main side of the second pedestal, and wherein the second perimeter ridge is in abutment with the first main side of the chip layer.

In some embodiments, a semiconductor package may include a first lead frame including a first pedestal and a first lead extending from the first pedestal, wherein a first perimeter ridge defines a first recessed area in a first main side of the first pedestal, and wherein a die pad is positioned within the first recessed area. The semiconductor package may further include a chip layer having a first main side opposite a second main side, wherein the second main side is in abutment with the first perimeter ridge of the pedestal of the first lead frame. The semiconductor structure may further include a clip including a second pedestal and a lead connector extending from the second pedestal, wherein a second perimeter ridge defines a second recessed area in a second main side of the second pedestal, and wherein the second perimeter ridge is in abutment with the first main side of the chip layer.

In some embodiments, a method of forming a package structure may include providing a first lead frame including a first pedestal and a first lead extending from the first pedestal, wherein a first perimeter ridge defines a first recessed area in a first main side of the first pedestal, and wherein a die pad is positioned within the first recessed area. The method may further include connecting a chip layer to the first lead frame, wherein the chip layer includes a first main side opposite a second main side, and wherein the second main side is in abutment with the first perimeter ridge of the pedestal of the first lead frame. The method may further include connecting a clip to the chip layer, wherein the clip includes a second pedestal and a lead connector extending from the second pedestal, wherein a second perimeter ridge defines a second recessed area in a second main side of the second pedestal, and wherein the second perimeter ridge is in abutment with the first main side of the chip layer.

BRIEF DESCRIPTION OF THE DRAWINGS

The accompanying drawings illustrate exemplary approaches of the disclosure, including the practical application of the principles thereof, as follows:

FIG. 6 is a flow chart of a method according to embodiments of the present disclosure.

Figure 1:
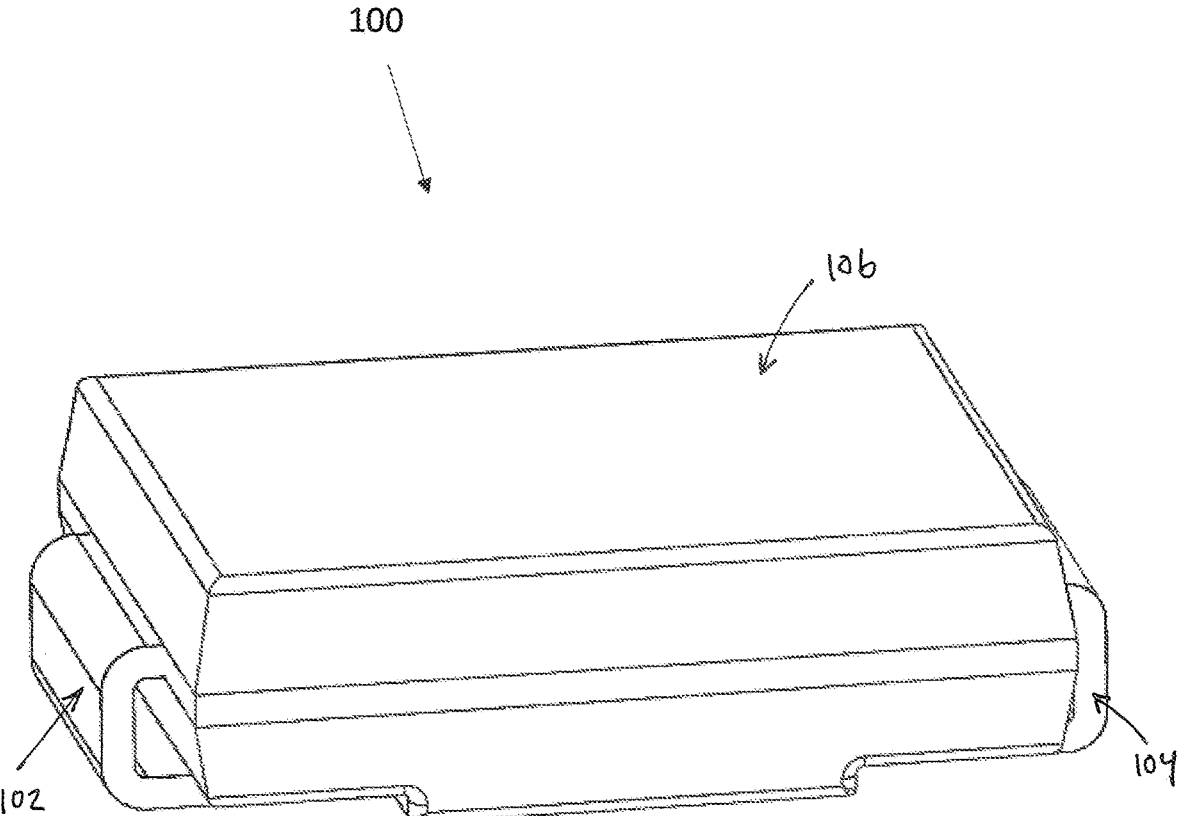
FIG. 1 is a perspective view of a semiconductor package according to embodiments of the present disclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

Furthermore, certain elements in some of the figures may be omitted, or illustrated not-to-scale, for illustrative clarity. Cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Devices, packages, and methods in accordance with the present disclosure will now be described more fully hereinafter with reference to the accompanying drawings, in which embodiments of the system and method are shown. The devices, packages, and methods, however, may be embodied in many different forms and should not be construed as being limited to the embodiments set forth herein. Rather, these embodiments are provided so that this disclosure will be thorough and complete, and will fully convey the scope of the devices, packages, and methods to those skilled in the art.

Figure 2:
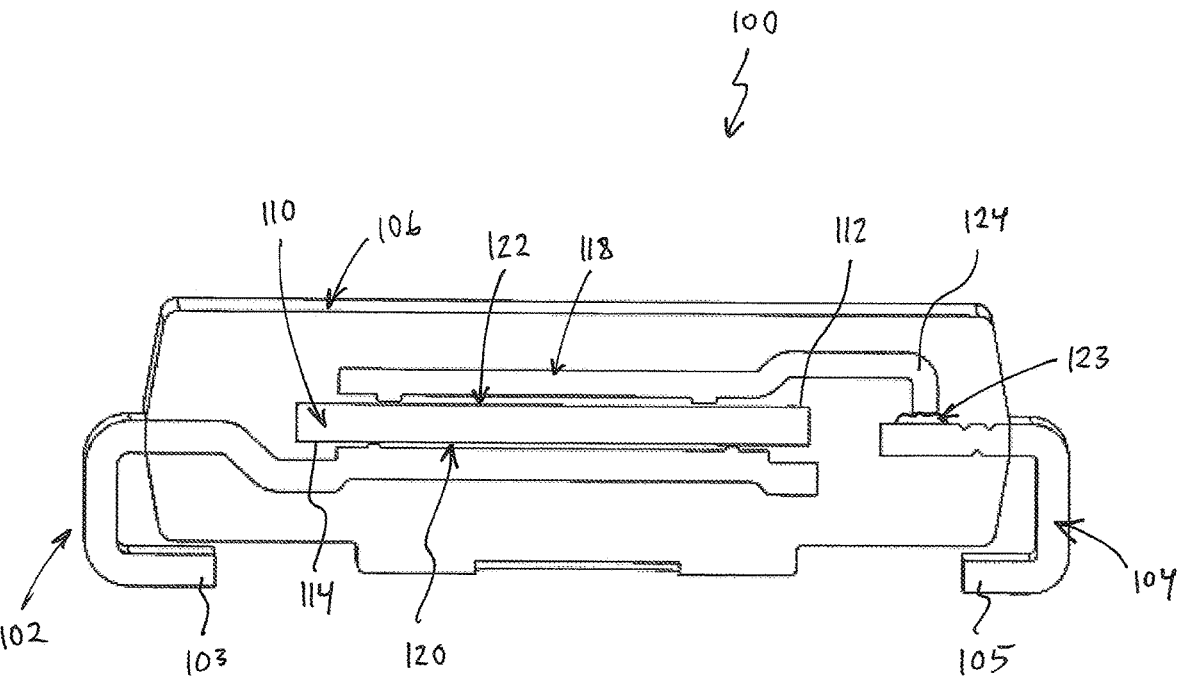
FIG. 2 is a side cross-sectional view of the semiconductor package according to embodiments of the present disclosure.

Referring to FIGS. 1-2, an exemplary embodiment of a semiconductor device or package structure 100 in accordance with the present disclosure is shown. The package structure (hereinafter "structure") 100 may include a first lead frame 102 and a second lead frame 104 partially within an encapsulation 106. The first lead frame 102 may include a first free end 103 and the second lead frame 104 may include a second free end 105. The first and second free ends 103, 105 may be coupleable with a substrate or PCB (not shown). As best shown in FIG. 2, the structure 100 may further include a chip layer 110 having a first main side 112 connected or in abutment with a clip 118 and a second main side 114 connected or in abutment with the second lead frame 102. A first solder 120 may be sandwiched between the first lead frame 102 and the second main side 114 of the chip layer 110, and a second solder 122 may be sandwiched between the first main side 112 of the chip layer 110 and the clip 118. A third solder 123 may connect a lead connector 124 of the clip 118 to the second lead frame 104.

Figure 3A:
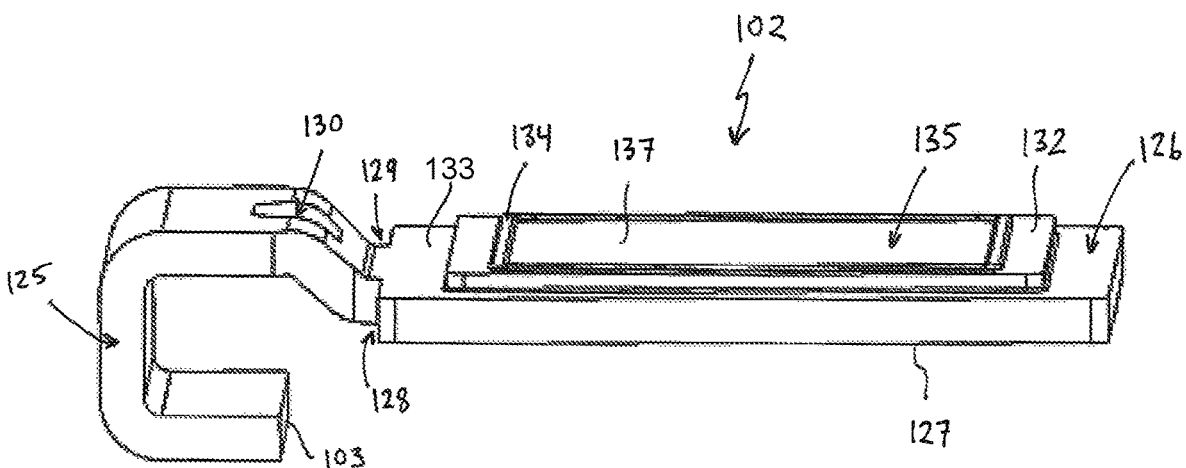
FIG. 3A is perspective view of a first lead frame of the semiconductor package according to embodiments of the present disclosure.
Figure 3B:
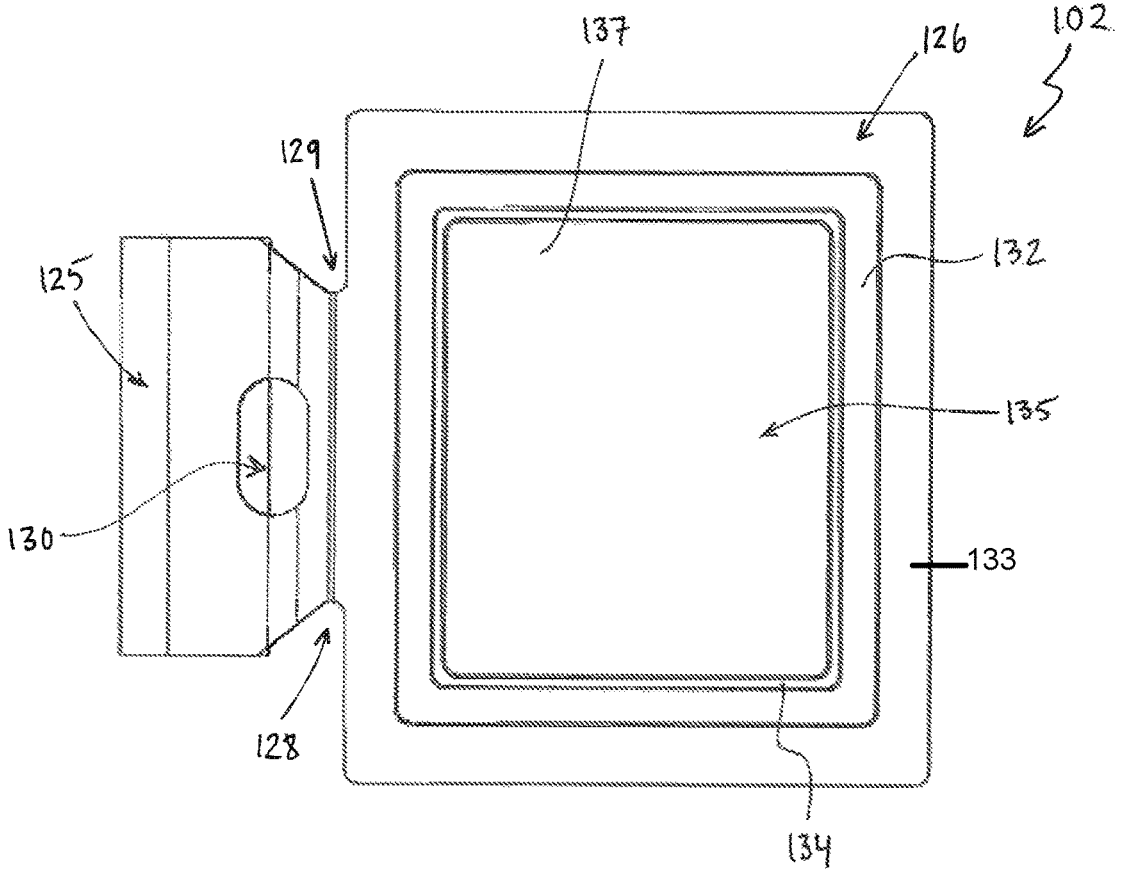
FIG. 3B is a top view of the first lead frame of the semiconductor package according to embodiments of the present disclosure.

FIGS. 3A-3B show the first lead frame 102 in greater detail. The first lead frame 102 may include a first lead 125 connected with a first pedestal 126. The first pedestal 126 may be generally flat or planar, having a first main side 133 opposite a second main side 127, while the first lead 125 curves or wraps around for connection with a substrate. To increase flexibility between the first lead 125 and the first pedestal 126, the first lead frame 102 may include a first slot 128, a second slot 129, and a fixed slot 130 at an intersection between the first lead 125 and the first pedestal 126.

As further shown, the first pedestal 126 may include a first stepped level 132 extending away from the first main side 133, and a first perimeter ridge 134 extending from the first stepped level 132. Advantageously, the first perimeter ridge 134 defines a first recessed area 135 operable to receive and retain the first solder 120 (FIG. 2) therein. When the structure 100 is assembled, the first perimeter ridge 134 may be in direct contact with, or close proximity to, the second main side 114 of the chip layer 110 to contain the first solder 120 within the first recessed area 135. In some embodiments, a die pad 137 may be present within the first recessed area 135. When the die pad 137 is present, the first solder 120 may connect the die pad 137 with the second main side 114 of the chip layer 110.

Figure 4A:
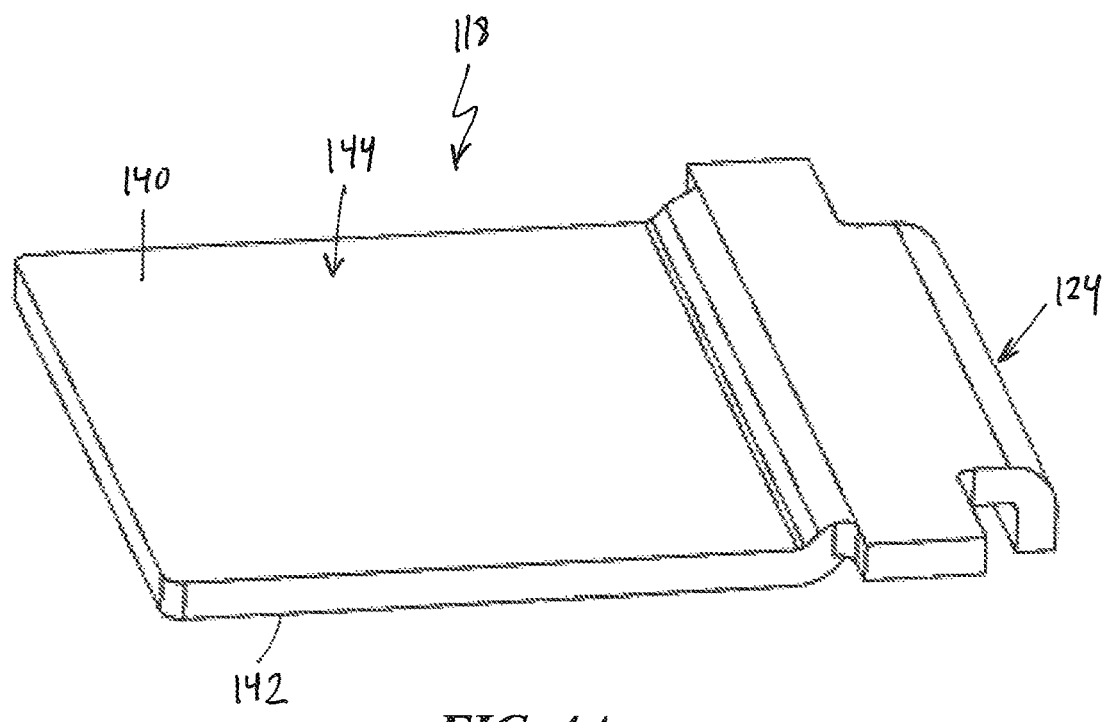
FIG. 4A is perspective view of a clip of the semiconductor package according to embodiments of the present disclosure.
Figure 4B:
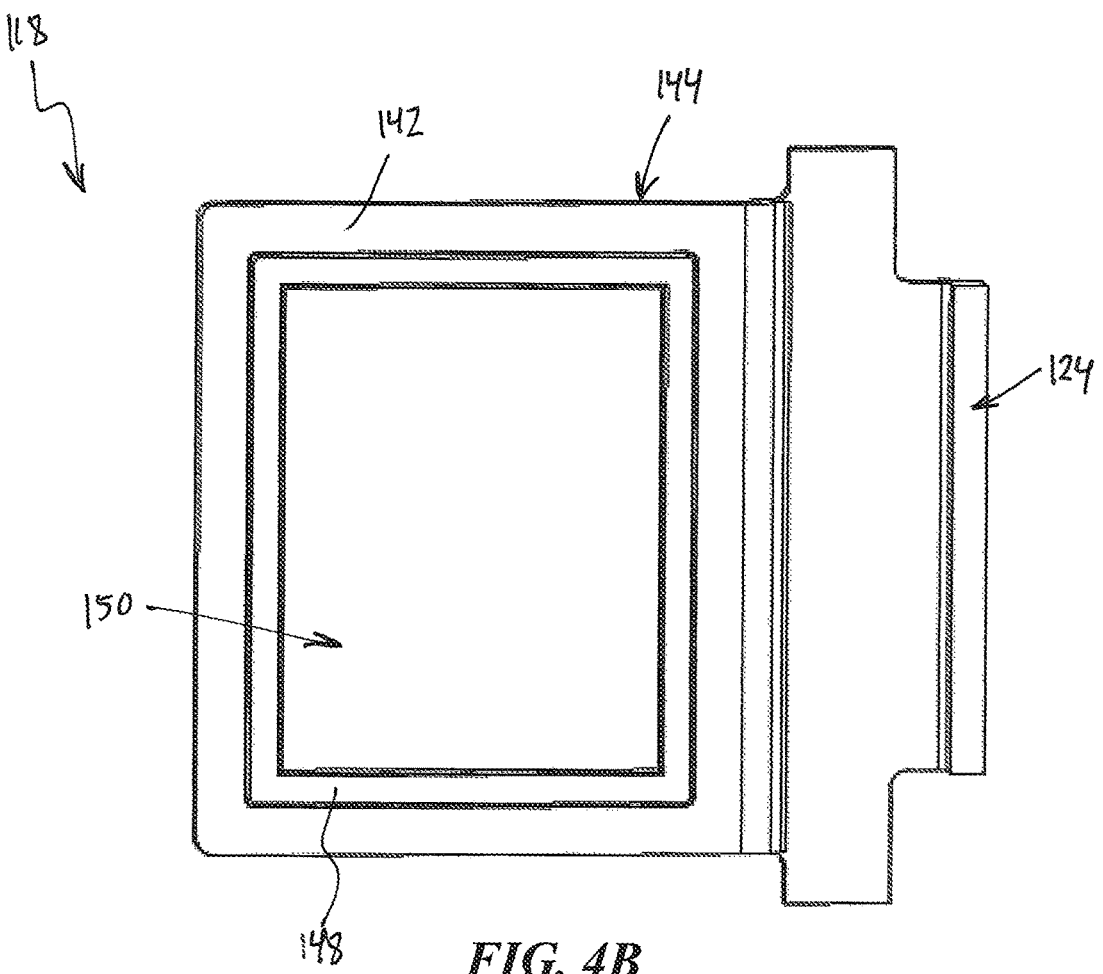
FIG. 4B is a top view of the clip of the semiconductor package according to embodiments of the present disclosure.

FIGS. 4A-4B show the clip 118 in greater detail. In some embodiments, the clip 118 may include a first main side 140 opposite a second main side 142, wherein the second main side 142 may abut the chip layer 110. As shown, the clip 118 may include a second pedestal 144 connected to the lead connector 124. As stated above, the third solder 123 may connect the lead connector 124 to the second lead frame 104.

As best shown in FIG. 4B, the clip 118 may include a second perimeter ridge 148 defining a second recessed area 150 along the second main side 142. When the structure 100 is assembled, the second perimeter ridge 148 is in abutment with, or close proximity to, the first main side 112 of the chip layer 110. As a result, the second solder 122 (FIG. 2) is better contained within the second recessed area 150 by the second perimeter ridge 148.

Figure 5:
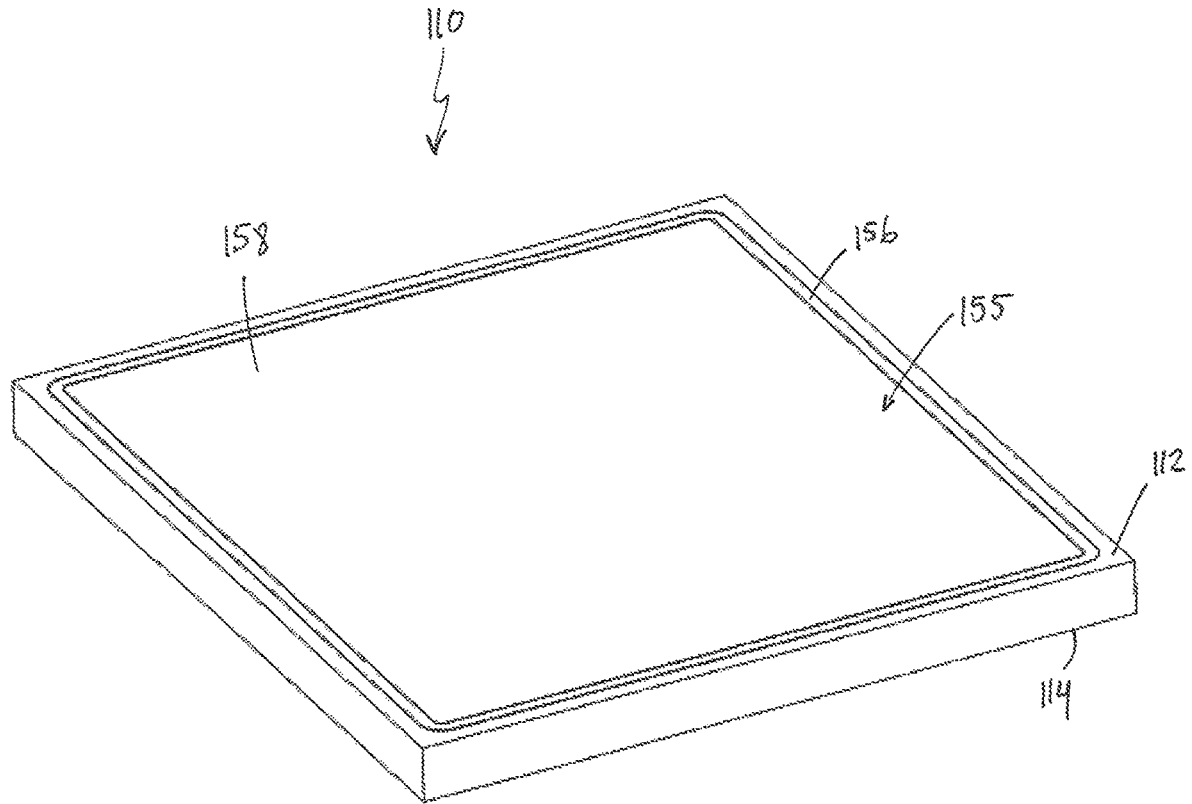
FIG. 5 is a perspective view of a chip layer of the semiconductor package according to embodiments of the present disclosure.

FIG. 5 shows the chip layer 110 in greater detail. In some embodiments, the first main side 112 of the chip layer 110 may include a third recessed area 155 defined by a perimeter or border 156. The chip layer 110 may include a transient-voltage-suppression (TVS) device 158 within the third recessed area 155. When the structure 100 is assembled, the second perimeter ridge 148 of the clip 118 may extend into the third recessed area 155, and the second solder 122 may connect the TVS device 158 with the second main side 142 of the second pedestal 144.

Turning now to FIG. 6, a method 200 for forming a package structure according to embodiments of the present disclosure will be described. At block 201, the method 200 may include providing a first lead frame including a first pedestal and a first lead extending from the first pedestal, wherein a first perimeter ridge defines a first recessed area in a first main side of the first pedestal, and wherein a die pad is positioned within the first recessed area.

At block 202, the method 200 may include connecting a chip layer to the first lead frame, wherein the chip layer includes a first main side opposite a second main side, and wherein the second main side is in abutment with the first perimeter ridge of the pedestal of the first lead frame.

In some embodiments, at block 203, the method 200 may further include connecting a clip to the chip layer, wherein the clip includes a second pedestal and a lead connector extending from the second pedestal, wherein a second perimeter ridge defines a second recessed area in a second main side of the second pedestal, and wherein the second perimeter ridge is in abutment with the first main side of the chip layer.

In some embodiments, the method 200 may further include providing a first solder between the first pedestal and the chip layer, wherein the first perimeter ridge and the first recessed area constrain movement of the first solder, and wherein the first solder is in direct contact with the die pad and the second main side of the chip layer. In some embodiments, the method may further include providing a second solder between the second pedestal and the chip layer, wherein the second perimeter ridge and the second recessed area constrain movement of the second solder. In some embodiments, the method may further include coupling a transient-voltage-suppression (TVS) device of the chip layer to the second pedestal using the second solder.

Although the illustrative method 200 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be necessary to implement a methodology in accordance with the present disclosure. Furthermore, the method 200 may be implemented in association with the formation and/or processing of structures illustrated and described herein as well as in association with other structures not illustrated.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other unless indicated.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A package structure, comprising:
a first lead frame including a first pedestal and a first lead extending from the first pedestal, wherein the first pedestal includes a first stepped level extending from a first main side thereof, wherein a first perimeter ridge extends from the first stepped level toward the chip layer and defines a first recessed area in the first stepped level of the first main side of the first pedestal, and wherein a die pad is positioned within the first recessed area;

a chip layer having a first main side opposite a second main side, wherein the second main side is in abutment with the first perimeter ridge of the first pedestal of the first lead frame; and a clip including a second pedestal and a lead connector extending from the second pedestal, wherein the second pedestal includes a second stepped level extending from a second main side thereof, wherein a second perimeter ridge extends from the second stepped level toward the chip layer and defines a second recessed area in the second stepped level of the second main side of the second pedestal, and wherein the second perimeter ridge is in abutment with the first main side of the chip layer.

2. The package structure of claim 1, further comprising a second lead frame connected to the lead connector of the clip.

3. The package structure of claim 2, further comprising an encapsulation surrounding the chip layer, wherein the first lead frame and a second lead frame extend through the encapsulation.

4. The package structure of claim 2, further comprising a first solder between the first pedestal and the chip layer, wherein the first perimeter ridge and the first recessed area constrain movement of the first solder.

5. The package structure of claim 4, wherein the first solder is in direct contact with the die pad and the second main side of the chip layer.

6. The package structure of claim 2, further comprising a second solder between the second pedestal and the chip layer, wherein the second perimeter ridge and the second recessed area constrain movement of the second solder.

7. The package structure of claim 6, further comprising a third solder between the lead connector and the second lead frame.

8. The package structure of claim 6, wherein the chip layer comprises a transient-voltage-suppression (TVS) device.

9. The package structure of claim 8, wherein the second solder couples the TVS device and the second pedestal.

10. A semiconductor package, comprising:
a first lead frame including a first pedestal and a first lead extending from the first pedestal, wherein the first pedestal includes a first stepped level extending from a first main side thereof, wherein a first perimeter ridge extends from the first stepped level toward the chip layer and defines a first recessed area in the first stepped level of the first main side of the first pedestal, and wherein a die pad is positioned within the first recessed area;

a chip layer having a first main side opposite a second main side, wherein the second main side is in abutment with the first perimeter ridge of the first pedestal of the first lead frame; and a clip including a second pedestal and a lead connector extending from the second pedestal, wherein the second pedestal includes a second stepped level extending from a second main side thereof, wherein a second perimeter ridge extends from the second stepped level toward the chip layer and defines a second recessed area in the second stepped level of the second main side of the second pedestal, and wherein the second perimeter ridge is in abutment with the first main side of the chip layer.

11. The semiconductor package of claim 10, further comprising:

a second lead frame connected to the lead connector of the clip; and an encapsulation surrounding the chip layer, wherein the first lead frame and a second lead frame extend outside the encapsulation.

12. The semiconductor package of claim 11, further comprising a first solder between the first pedestal and the chip layer, wherein the first perimeter ridge and the first recessed area constrain movement of the first solder, and wherein the first solder is in direct contact with the die pad and the second main side of the chip layer.

13. The semiconductor package of claim 11, further comprising a second solder between the second pedestal and the chip layer, wherein the second perimeter ridge and the second recessed area constrain movement of the second solder.

14. The semiconductor package of claim 13, further comprising a third solder between the lead connector and the second lead frame.

15. The semiconductor package of claim 13, wherein the chip layer comprises a transient-voltage-suppression (TVS) device.

16. The semiconductor package of claim 15, wherein the second solder couples the TVS device and the second pedestal.

17. A method of forming a package structure, comprising:

providing a first lead frame including a first pedestal and a first lead extending from the first pedestal, forming a first stepped level in a first main side of the first pedestal, wherein a first perimeter ridge extends from the first stepped level toward a chip layer to be mounted thereon and defines a first recessed area in the first stepped level of the first main side of the first pedestal, and wherein a die pad is positioned within the first recessed area; connecting a chip layer to the first lead frame, wherein the chip layer includes a first main side opposite a second main side, and wherein the second main side is in abutment with the first perimeter ridge of the first pedestal of the first lead frame; and connecting a clip to the chip layer, wherein the clip includes a second pedestal and a lead connector extending from the second pedestal, forming a second stepped level in a second main side of the second pedestal, wherein a second perimeter ridge extends from the second stepped level toward the chip layer and defines a second recessed area in the second stepped level of the second main side of the second pedestal, and wherein the second perimeter ridge is in abutment with the first main side of the chip layer.

18. The method of claim 17, further comprising providing a first solder between the first pedestal and the chip layer, wherein the first perimeter ridge and the first recessed area constrain movement of the first solder, and wherein the first solder is in direct contact with the die pad and the second main side of the chip layer.

19. The method of claim 17, further comprising providing a second solder between the second pedestal and the chip layer, wherein the second perimeter ridge and the second recessed area constrain movement of the second solder.

20. The method of claim 19, further comprising coupling a transient-voltage-suppression (TVS) device of the chip layer to the second pedestal using the second solder.

* * * * *